United States Patent
Mehta

(10) Patent No.: US 7,128,843 B2
(45) Date of Patent: Oct. 31, 2006

(54) PROCESS FOR FABRICATING MONOLITHIC MEMBRANE SUBSTRATE STRUCTURES WITH WELL-CONTROLLED AIR GAPS

(75) Inventor: Sarabjit Mehta, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 215 days.

(21) Appl. No.: 10/786,824

(22) Filed: Feb. 24, 2004

(65) Prior Publication Data

US 2004/0197526 A1    Oct. 7, 2004

Related U.S. Application Data

(60) Provisional application No. 60/460,524, filed on Apr. 4, 2003.

(51) Int. Cl.
*H01L 21/00* (2006.01)
(52) U.S. Cl. .............................. 216/2; 216/41; 216/96; 216/99; 438/52; 257/415
(58) Field of Classification Search .................... 216/2, 216/41, 96, 99; 438/52; 257/415
See application file for complete search history.

(56) References Cited

U.S. PATENT DOCUMENTS

| 5,461,003 | A |  | 10/1995 | Havemann et al. ......... 438/666 |
|---|---|---|---|---|
| 5,510,645 | A |  | 4/1996 | Fitch et al. ................. 257/522 |
| 5,738,799 | A |  | 4/1998 | Hawkins et al. .............. 216/27 |
| 5,853,601 | A | * | 12/1998 | Krishaswamy et al. ........ 216/2 |
| 6,251,798 | B1 |  | 6/2001 | Soo et al. .................... 438/758 |
| 6,287,979 | B1 |  | 9/2001 | Zhou et al. ................. 438/723 |
| 2002/0020053 | A1 | * | 2/2002 | Fonash et al. ............. 29/623.1 |

OTHER PUBLICATIONS

Barker, N.S., "Distributed MEMS True-Time Delay Phase Shifters and Wide-Band Switches," *IEEE Transactions on Microwave Theory and Techniques*, vol. 46, No. 11, pp. 1881-1890 (Nov. 1998).

* cited by examiner

*Primary Examiner*—Shamim Ahmed
(74) *Attorney, Agent, or Firm*—Ladas & Parry LLP

(57) ABSTRACT

A process for fabricating monolithic membrane structures having air gaps is disclosed, comprising the steps of: providing a wafer; depositing and patterning a protective layer on the wafer; providing a trench in the wafer; depositing and patterning a metal in the trench; depositing and patterning a sacrificial layer on the metal; depositing and patterning a membrane pad on the sacrificial layer; providing a polymeric film on the protective layer and sacrificial layer, wherein part of the polymeric film has a tensile stress; and releasing part of the polymeric film from the protective layer and sacrificial layer, wherein the tensile stress of a portion of the polymeric film releases the portion of the polymeric film from the wafer and generates the air gap.

52 Claims, 8 Drawing Sheets

PROCESS FOR FABRICATING MONOLITHIC MEMBRANE SUBSTRATE STRUCTURES WITH WELL-CONTROLLED AIR GAPS

CLAIM OF BENEFIT OF PROVISIONAL APPLICATION

This application claims the benefit of U.S. provisional application Ser. No. 60/460,524 filed on Apr. 4, 2003, which is incorporated herein by reference in its entirety.

BACKGROUND OF THE INVENTION

1. Field of the Invention

The present invention relates to a process for fabricating a monolithic structure comprising a polymeric membrane on a patterned substrate and to a monolithic membrane-substrate structure. The monolithic membrane-substrate structure has a well-controlled air gap in between.

2. Description of the Related Art

Prior fabrication processes for making structures with well-controlled air gaps have used sacrificial layers to form the gap. However, the use of sacrificial layers to form release membranes or cantilever type structures suffers from certain limitations. The size of the air gap obtained from these processes is determined entirely by the height of the sacrificial layer. Since deposition of any sacrificial layer ($SiO_2$, SiN, etc.) is time consuming and costly, the layer thickness is not much greater than about 1 μm. This severely limits the gap size, and also the lateral dimensions that the released structures can have.

Other related techniques that are useful for achieving large air gaps consist of bonding together two separate sections either directly or by means of an adhesive. One of the pieces is recessed or contains a cavity that gives the required gap. Such a process is not monolithic in nature, and hence involves a more tedious and costly assembly procedure. Also, the size of the air gap may not be as uniform due to the difficulties associated with the bonding process.

Numerous examples exist in the prior art that use the concept of sacrificial layers to release membranes and cantilevers, and realize air gaps. For example, U.S. Pat. No. 5,738,799 discloses using a sacrificial layer for an ink-jet printhead fabrication technique. Furthermore, N. S. Barker and G. M. Rebeiz also discuss use of sacrificial layers for phase shifters and wide-band switches in the publication "Distributed MEMS True-Time Delay Phase Shifters and Wide-Band Switches" (IEEE Transactions on Microwave Theory and Techniques, vol. 46, no. 11, Nov. 1998).

However, none of the prior art documents relies on the tensile stress intrinsically present in certain membranes to form released structures with air gaps much larger than the thickness of the sacrificial layer. The present invention achieves this, and also provides a means of ensuring that the tensile stress in the released membranes is retained.

SUMMARY OF THE INVENTION

The present invention discloses a process for fabricating a monolithic structure having an air gap and consisting of a preferably polyimide membrane on a patterned silicon substrate. The process and resulting device do not require bonding of two separate sections to achieve the air gaps. The structure is easy to fabricate, reliable, and can be miniaturized using standard cleanroom processing techniques. Therefore, the size of the gap can be controlled with extreme precision. Furthermore, any desired layer can be patterned on the membrane or substrate surfaces forming the microchamber. The metal layers can easily be used as electrodes for electrostatic actuation of the membrane, providing tuning capability for any application. The process and resulting device relies on the use of an intermediate sacrificial layer to release the membrane. However, unlike conventional techniques, the height of the sacrificial layer does not determine the size of the air gap that is eventually obtained. This represents a significant advantage in fabricating tunable electronic components that require relatively large air gaps that would be impossible or extremely cost prohibitive to realize using conventional methods. The process also ensures that the polyimide membrane retains the desirable tensile stress.

According to a first embodiment, the present invention discloses a process for fabricating membrane-substrate structures comprising: providing a substrate; depositing a protective layer on said substrate; forming a trench in said substrate, said trench having a trench depth; depositing a first intermediate layer in said trench; depositing a sacrificial layer on said first intermediate layer, said sacrificial layer having a sacrificial layer depth; depositing and patterning a second intermediate layer on said sacrificial layer; depositing a layer of polymeric material on said second intermediate layer and said sacrificial layer, said layer of polymeric material contacting said second intermediate layer; removing said sacrificial layer; and forming an air gap between the layer of polymeric material and the substrate by release of said layer of polymeric material upon removal of said sacrificial layer, whereby said air gap has an air gap depth greater than said sacrificial layer depth.

According to a second embodiment, the present invention discloses a process for fabricating membrane-substrate structures comprising the steps of: providing a substrate having a one side and an other side; depositing a first protective layer on said one side and a second protective layer on said other side; forming a trench in said substrate, said trench having a trench depth; depositing a third protective layer in said trench; depositing a first intermediate layer on said third protective layer; depositing a sacrificial layer on said first intermediate layer and said third protective layer, said sacrificial layer having a sacrificial layer depth; depositing a second intermediate layer on said sacrificial layer; depositing a layer of polymeric material on said first protective layer, said second intermediate layer, and said sacrificial layer; removing said sacrificial layer; and forming an air gap between the layer of polymeric material and the substrate by release of said layer of polymeric material from said sacrificial layer upon removal of said sacrificial layer, whereby said air gap has an air gap depth greater than said sacrificial layer depth.

According to a third embodiment, the present invention discloses a process for restoring tensile stress to a monolithic membrane-substrate structure comprising the steps of: a) fabricating a membrane-substrate structure, said step of fabricating the membrane-substrate structure comprising: a1) providing a substrate having a one side and an other side; a2) depositing a first protective layer on said one side and a second protective layer on said other side; a3) forming a trench in said substrate, said trench having a trench depth; a4) depositing a third protective layer in said trench; a5) depositing a first intermediate layer on said third protective layer; a6) depositing a sacrificial layer on said first intermediate layer and said third protective layer, said sacrificial layer having a sacrificial layer depth; a7) depositing a second intermediate layer on said sacrificial layer; a8)

depositing a layer of polymeric material on said first protective layer, said second intermediate layer, and said sacrificial layer; a9) removing said sacrificial layer; and a10) forming an air gap between the layer of polymeric material and the substrate by release of said layer of polymeric material from said sacrificial layer upon removal of said sacrificial layer, whereby said air gap has an air gap depth greater than said sacrificial layer depth; b) providing a wafer; c) disposing said membrane-substrate structure on said wafer; d) heating said wafer and said membrane-substrate structure; and e) cooling said wafer and said membrane-substrate structure to room temperature.

According to a fourth embodiment, the present invention discloses a process for restoring tensile stress to a monolithic membrane-substrate structure comprising the steps of: a) fabricating a membrane-substrate structure, said step of fabricating the membrane-substrate structure comprising: a1) providing a substrate; a2) depositing a protective layer on said substrate; a3) forming a trench in said substrate, said trench having a trench depth; a4) depositing a first intermediate layer in said trench; a5) depositing a sacrificial layer on said first intermediate layer, said sacrificial layer having a sacrificial layer depth; a6) depositing and patterning a second intermediate layer on said sacrificial layer; a7) depositing a layer of polymeric material on said second intermediate layer and said sacrificial layer, said layer of polymeric material contacting said second intermediate layer; a8) removing said sacrificial layer; and a9) forming an air gap between the layer of polymeric material and the substrate by release of said layer of polymeric material upon removal of said sacrificial layer, whereby said air gap has an air gap depth greater than said sacrificial layer depth; b) providing a wafer; c) disposing said membrane-substrate structure on said wafer; d) heating said wafer and said membrane-substrate structure; and e) cooling said wafer and said membrane-substrate structure to room temperature.

According to a fifth embodiment, the present invention discloses a monolithic membrane-substrate structure, comprising: a substrate having a trench, said trench having a trench depth; a protective layer located on the substrate; a layer of polymeric material located above the substrate and the protective layer; a first intermediate layer located in said trench; a second intermediate layer located under said layer of polymeric material and contacting said layer of polymeric material; and an air gap between the layer of polymeric material and the substrate.

According to a sixth embodiment, the present invention discloses a monolithic membrane-substrate structure, comprising: a substrate having a first side; a first protective layer disposed on the first side of the substrate; a second protective layer disposed on the second side of the substrate; a third protective layer disposed on the first side of the substrate; a layer of polymeric material located above the first and third protective layer; a first intermediate layer located above said third protective layer and contacting said third protective layer; a second intermediate layer located under said layer of polymeric material and contacting said layer of polymeric material; and an air gap between the layer of polymeric material and the substrate.

The process of the present invention can also realize large trench depths of about 50 μm or more. With large trench depths of about 50 μm or greater, the residual stress in the released polymeric, preferably polyimide, membrane may not be sufficient to keep the membrane taunt. This is not desirable from an application point of view, as the tuning ability and response time of the structure could be degraded. A further embodiment of the present invention solves this problem, by providing a process for restoring tensile stress to a monolithic membrane-substrate structure comprising the steps of: fabricating a membrane-substrate structure; providing a wafer; disposing said membrane-substrate structure on said wafer; heating said wafer and said membrane-substrate structure; and cooling said wafer and said membrane-substrate structure to room temperature.

The main purpose of the air gap structure is to realize tunable RF capacitors with an air dielectric (for low loss), for use in tunable filters and phase shifters. In particular, the filters and phase shifters can be tuned by controlling the movement of the membrane.

BRIEF DESCRIPTION OF THE DRAWINGS

The present invention will be understood and appreciated more fully from the following detailed description taken in conjunction with the drawings in which.

DETAILED DESCRIPTION OF THE INVENTION

Figure 1:
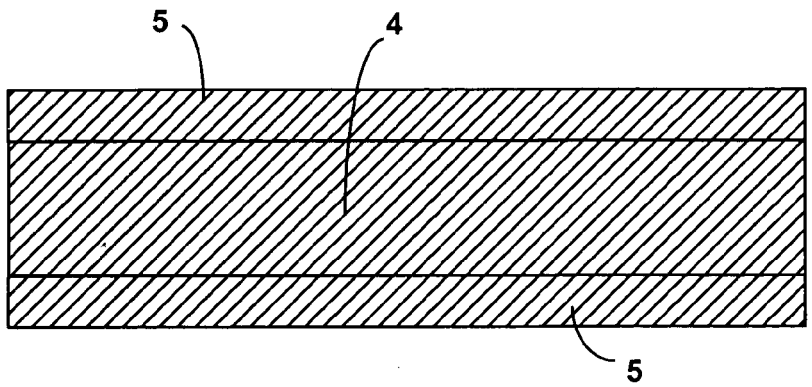
FIGS. 1–10 show a series of steps on a membrane-substrate structure, performed in accordance with a first embodiment of the process of the present invention.

In one embodiment of the current invention a silicon substrate or wafer 4 has protective layers 5 of $Si_3N_4$ deposited on both sides of the silicon wafer by, for example, plasma enhanced chemical vapor deposition (PECVD), as shown in FIG. 1. Preferably, the layers 5 are about 0.5 μm thick.

Figure 2:
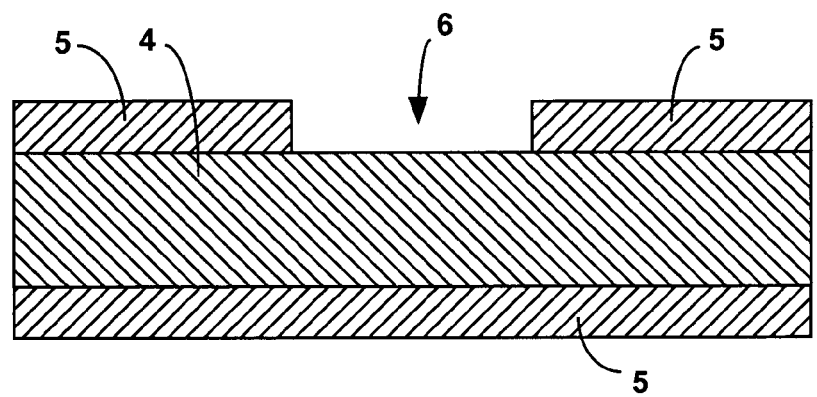

A window 6, as shown in FIG. 2, is then patterned in one of the layers 5 so that the silicon wafer 4 lying underneath the layer 5 can be etched.

Figure 3:
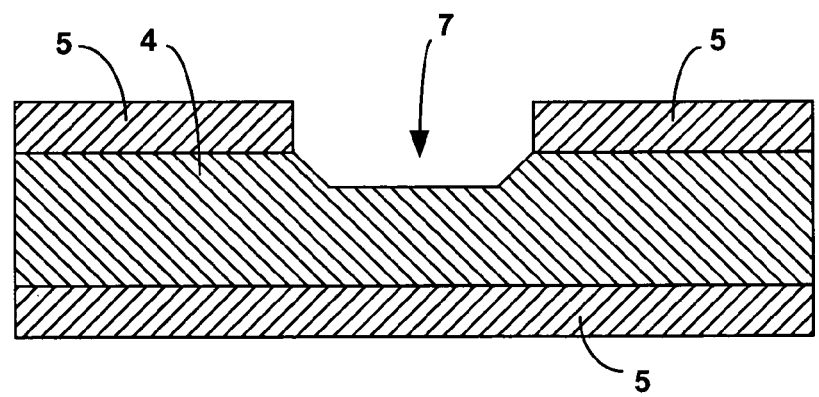

Next, a trench 7, shown in FIG. 3, is etched in the silicon wafer 4. Preferably, the etchant used in this step is a KOH solution and the trench 7 has a depth of between about 5 and about 50 μm.

Figure 4:
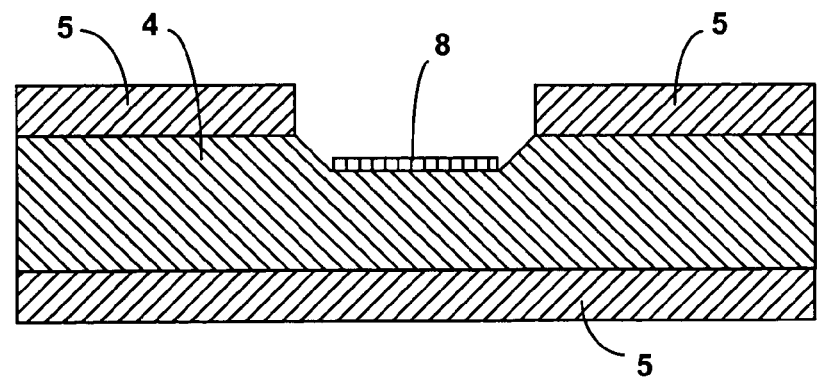

A metal pad 8, an example of which is shown in FIG. 4, is deposited and patterned in the trench 7. Preferably the metal pad 8 consists of a Ti—Au film having a thickness of about 1 μm. The metal pad 8 can be, for example, an electrode for electrostatic actuation.

The following figures show embodiments where the upper protective layer 5 is present, even after formation of the trench 7. However, once the trench is formed, the upper protective layer is not necessary anymore and can be removed.

Figure 5:
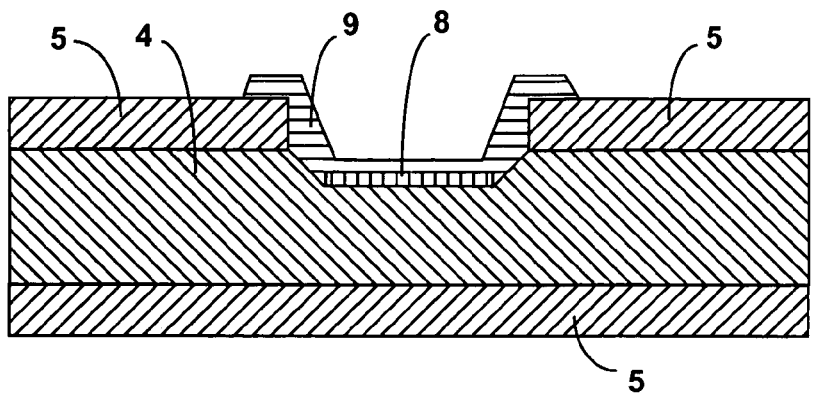

A sacrificial layer 9, shown in FIG. 5, is then deposited and patterned on top of the metal pad 8 to have a lateral dimension, in plan view, larger than the corresponding dimensions of the window 6 in the top layer 5. In this embodiment, the sacrificial layer 9 is about 50 μm wider than the window 6. The sacrificial layer 9 should preferably be larger than the lateral dimension of the window 6 to prevent the membrane from attaching to the trench sidewalls. Further, the sacrificial layer 9 is preferably 1 μm thick and composed of metal, PECVD $SiO_2$, KCl, or the like. The material for the sacrificial layer 9 is selected such that the chemical or technique used to eventually dissolve away the sacrificial layer 9 does not attack a polymeric film, preferably a polyimide film.

Figure 6:
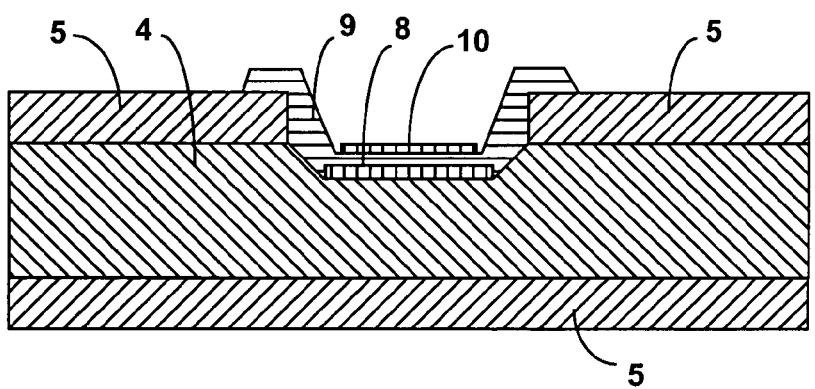

An intermediate layer 10, shown in FIG. 6, is then patterned and deposited on the sacrificial layer 9.

Figure 7:
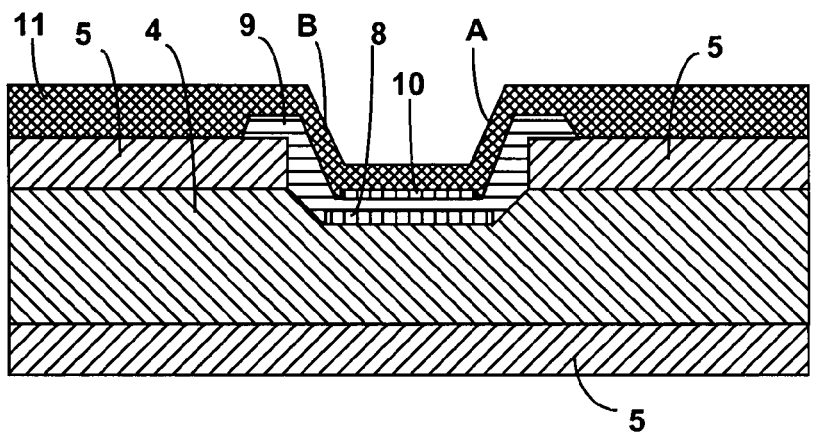

A layer of polymeric material or film 11, shown in FIG. 7, is then spun onto the silicon wafer 4 and cured at a temperature of about 300° C. The polymeric film 11 used should preferably shrink by about 20–40% upon final curing. The polymeric film is under tensile stress.

Figure 8:
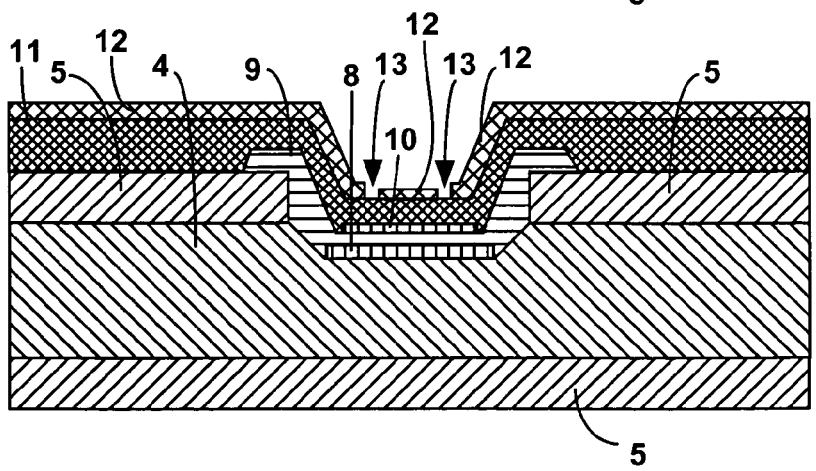
Figure 9:
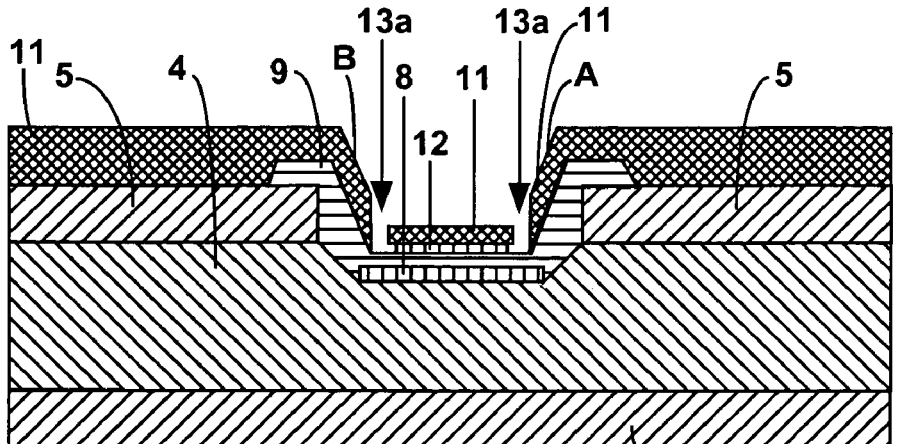

A metal mask 12, shown in FIG. 8 and preferably composed of Al, is then preferably deposited on the polymeric film 11 and patterned to have mask holes 13. The function of the mask holes 13 is that of allowing etching of the underlying portions of the polymeric film 11. The polymeric film 11 is dry etched, preferably using reactive ion etching (RIE), in correspondence of the mask holes 13, leaving film holes 13a in the polymeric film 11, as shown in FIG. 9.

The metal mask 12 is then removed, for example by a metal etchant such as Al etchant for an Al metal mask. The metal etchant used will depend on the composition of the metal mask used.

Figure 10:
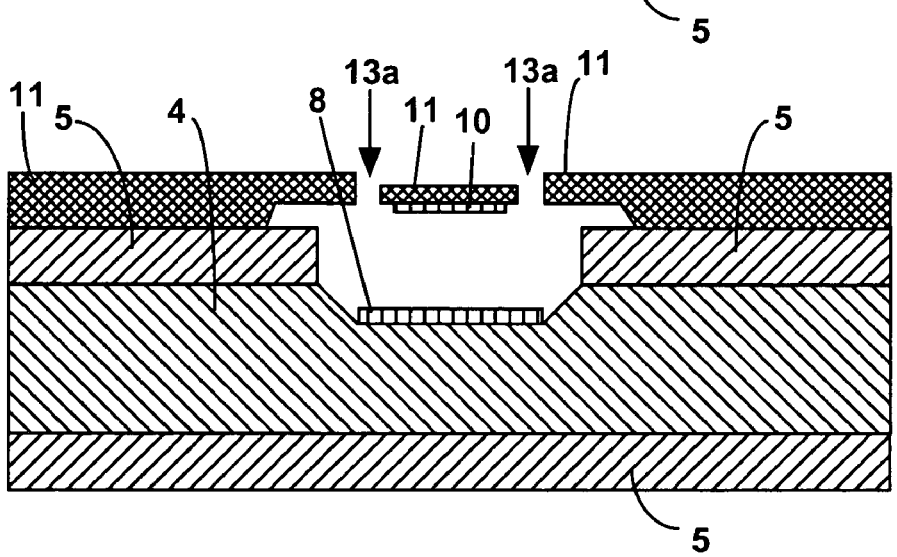

As shown in FIG. 10, the sacrificial layer 9 is then removed by immersing the device in a solution such as BOE for $SiO_2$, or hot DI water for KCl. This last step, as shown in FIG. 10, releases the polymeric film 11 from the substrate. Since the polymeric material is under tensile stress, the air gap height obtained is determined by the original depth of the trench 7, and not only by the height of the sacrificial layer. The depth of the trench 7 is, in general, much larger than the depth or thickness of the sacrificial layer 9.

Figure 11:
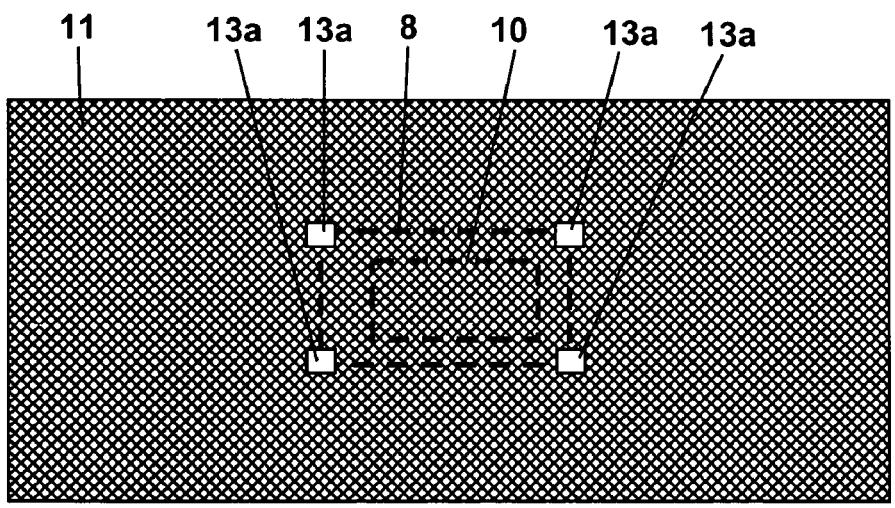
FIG. 11 shows a top plan view of the membrane-substrate structure obtained through the first embodiment of the process according to the present invention.

FIG. 11 shows a view from the top of FIG. 10, thus better showing a preferred position of the holes 13a in the polymeric film 11. Also shown are the metal layers 8 and 10, in dotted lines.

Figure 12:
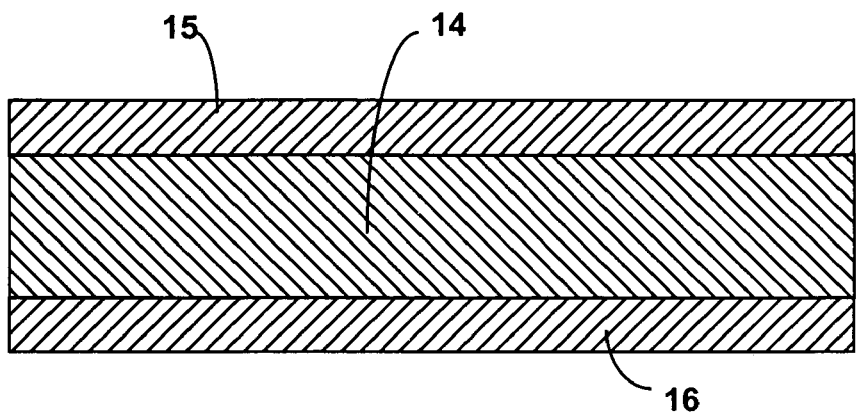
FIGS. 12–22 show a series of steps on a membrane-substrate structure, performed in accordance with a second embodiment of the process of the present invention.

In another embodiment of the process of the present invention, a protective layer 15 of $Si_3N_4$ is deposited on the top of a silicon wafer 14 and a protective layer 16 of $Si_3N_4$ is deposited on the bottom of the silicon wafer 14, preferably by plasma enhanced chemical vapor deposition (PECVD) or low pressure chemical vapor deposition (LPCVD) as shown in FIG. 12. Preferably, the layers 15, 16 are about 0.5 μm thick.

The following figures show embodiments where the protective layer 15 is present, even after formation of the trench 17. However, once the trench is formed, the protective layer is not necessary anymore and can be removed.

Figure 13:
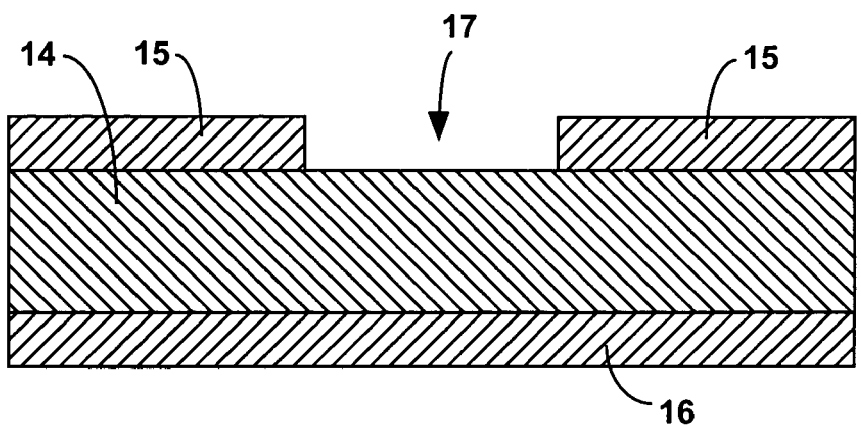

A window 17, shown in FIG. 13, is then patterned in the top layer 15 so that the silicon wafer 14 lying underneath the top layer 15 can be etched.

Figure 14:
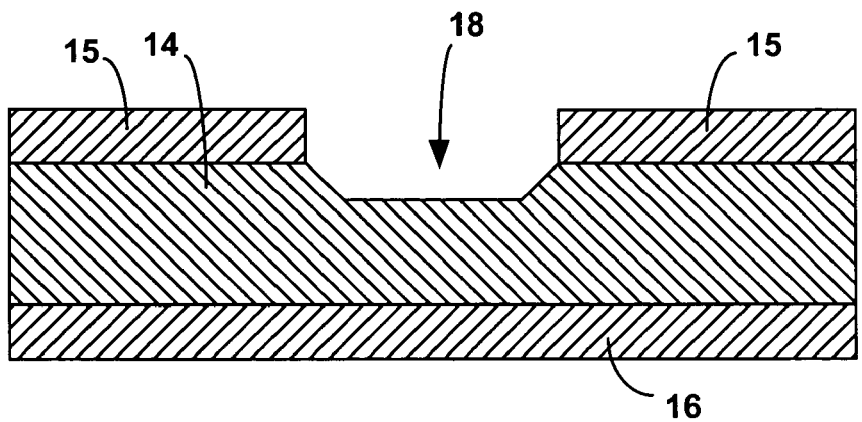

Next, a trench 18, shown in FIG. 14, is etched in the silicon wafer 14. Preferably, the etchant used in this step is a KOH solution and the trench 18 has a depth of between about 5 and about 50 μm.

Figure 15:
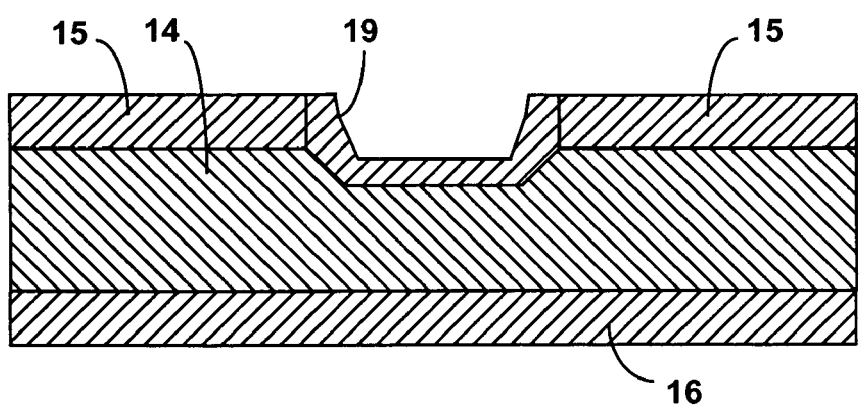

Further to this, another protective layer 19 of $Si_3N_4$, shown in FIG. 15, is deposited in the trench 18 to act as an etch stop layer 19 later.

Figure 16:
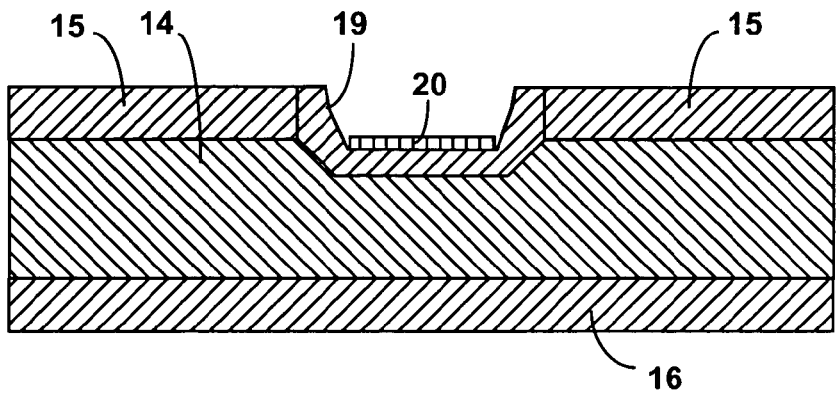

A first metal layer 20, shown in FIG. 16, is deposited and patterned in the trench 18 and covers the etch stop layer 19. The patterned metal layer 20 is preferably composed of a Ti—Au film and has a thickness of about 1 μm. The metal layer 20 can either form an electrode or reinforce the etch stop layer 19.

Figure 17:
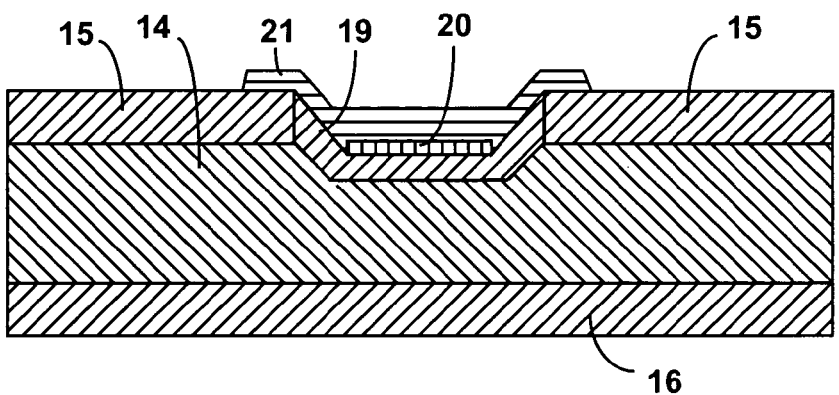

A sacrificial layer 21, shown in FIG. 17, is then deposited and patterned on top of the first metal pad 20. The sacrificial layer 21 has a lateral dimension which is larger than a corresponding lateral dimension of the window 16 in the layer 19. In this embodiment, the lateral dimension of the sacrificial layer 21 is about 50 μm larger than the lateral dimension of the window 17. The sacrificial layer 21 should preferably be larger than the lateral dimension of the window 16 to prevent the membrane from attaching to the trench sidewalls.

The material for the sacrificial layer 21 is chosen such that the chemical used to eventually dissolve away the sacrificial layer 20 does not attack a polymeric film, preferably a polyimide film. For example, the sacrificial layer 21 is composed of metal, $SiO_2$, KCl, or the like, and is preferably 1 μm thick.

Figure 18:
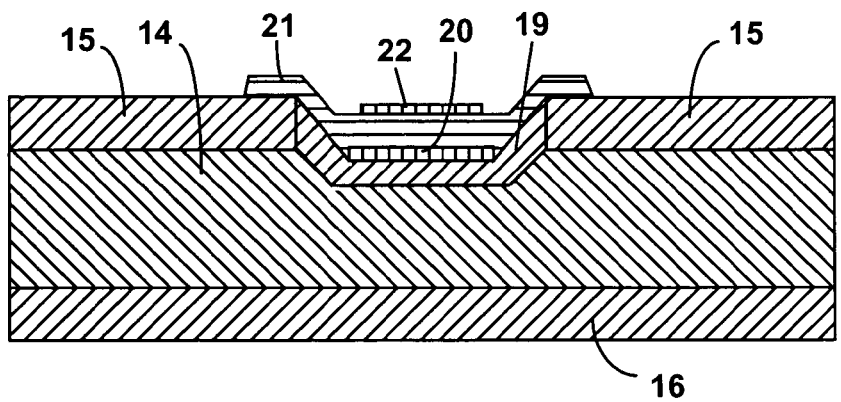

Next, a second metal pad 22, shown in FIG. 18, is deposited and patterned on the sacrificial layer 21.

Figure 19:
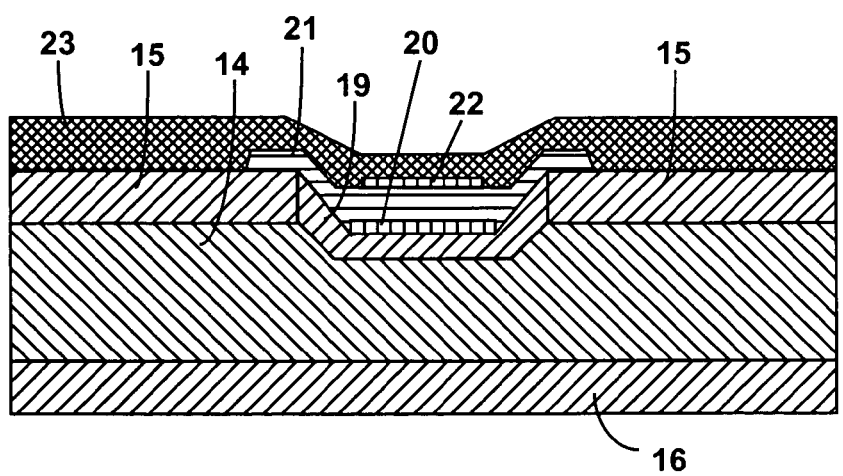

A polymeric film 23, shown in FIG. 19, is then spun onto the top layer 15 and cured at a temperature of about 300° C. The polymeric film 23 should preferably shrink by about 20–40% upon final curing.

Figure 20:
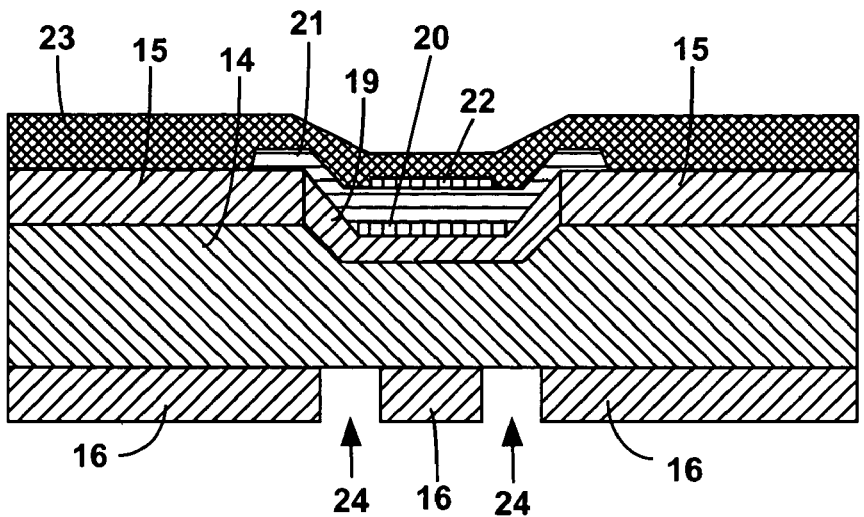

The bottom protective layer 16 is then patterned to form an etch mask as shown in FIG. 20. The silicon wafer 14 is mounted onto a holder (not shown) to protect the top layer 15, and etched, preferably in KOH solution. This etching step opens access holes 24 in the bottom layer 16 as shown in FIG. 20.

Figure 21:
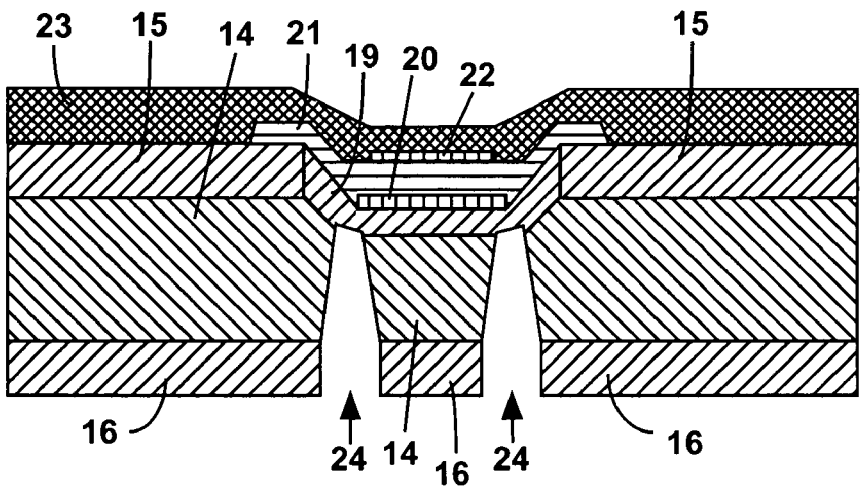

In FIG. 21, the portions of the silicon wafer 14 directly above the access holes 24 are etched to the etch stop layer 19.

Figure 22:
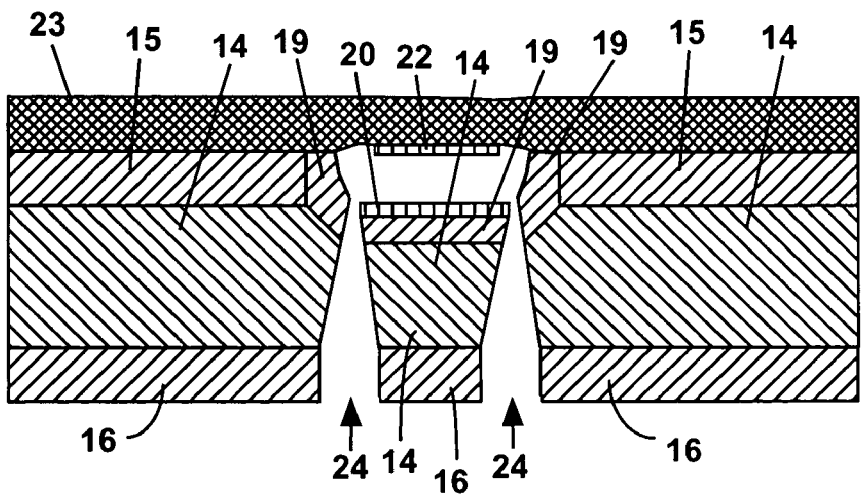

As shown in FIG. 22, the layer 19 is then dry etched or wet etched, and the sacrificial layer 21 is then removed by immersion in a solution, such as BOE for $SiO_2$, or hot deionized water for KCl. The tensile stress in the polymeric membrane 23 releases the membrane and a gap height equal to the original trench 18 depth is obtained as shown in FIG. 22.

Figure 23:
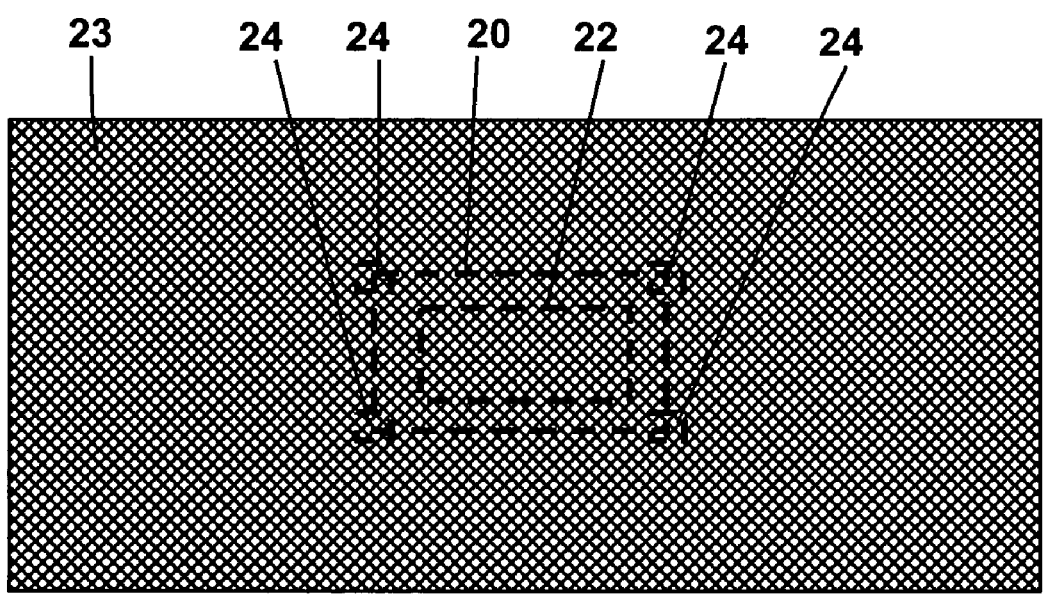
FIG. 23 shows a top plan view of the membrane-substrate structure obtained through the second embodiment of the process of the present invention.

FIG. 23 shows a view from the top of FIG. 12, thus better showing a preferred position of the holes 24 below the polymeric film 23. Also shown are the metal layers 20 and 22, in dotted lines.

Figure 24A:
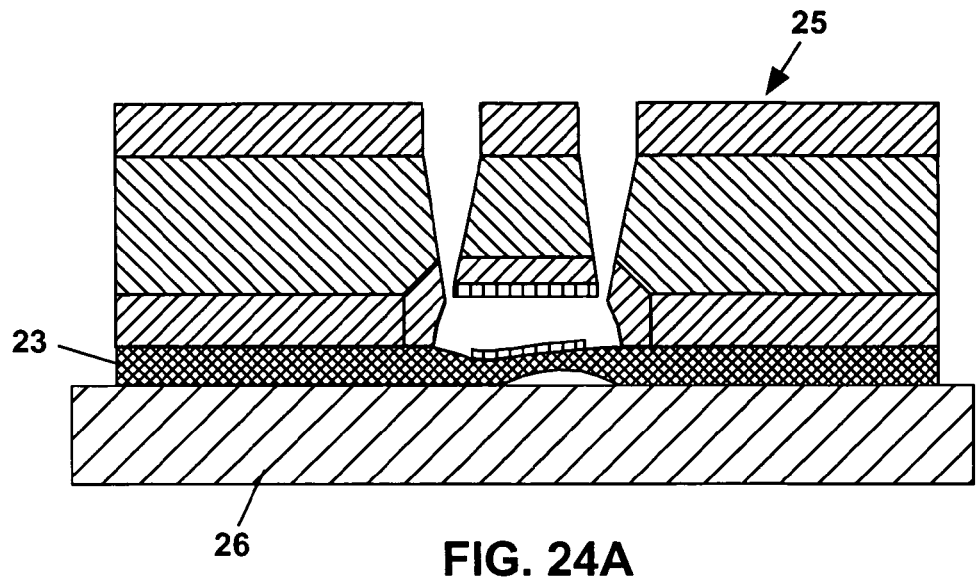
FIGS. 24A–24C show a cross section of a device, in which large trench depths are realized, following sequential steps according to a third embodiment of the present invention.
Figure 24B:
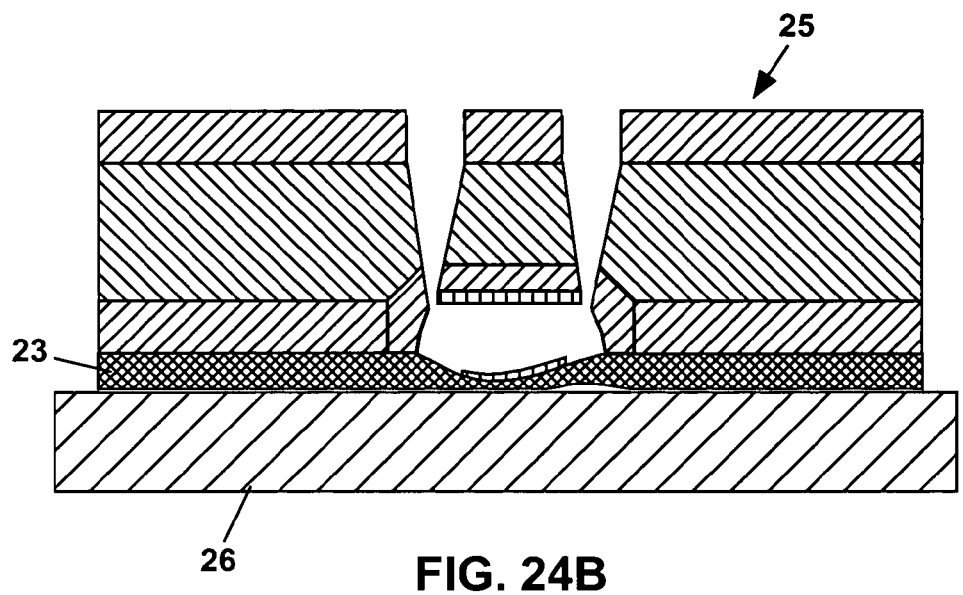
Figure 24C:
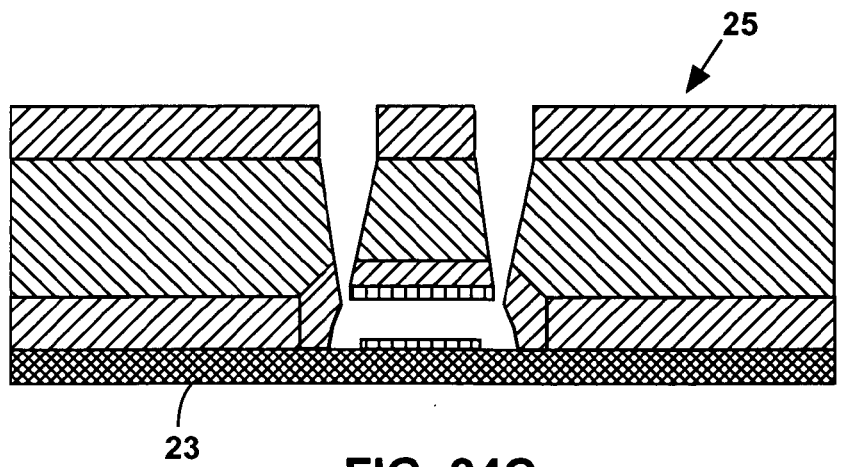

In a third embodiment of the process of the present invention, large trench depths, preferably of about 50 μm or greater, can be realized. This is shown in FIGS. 24A–24C below. A released membrane-substrate structure 25, like for example the structure of FIG. 22, is placed on a flat, rough surface 26, preferably the unpolished side of a silicon wafer, with the polymeric, preferably polyimide, film 23 facing down as shown in FIG. 24A. In a different embodiment, also the structure shown in FIG. 10 can be used.

The membrane-substrate structure 25 and the unpolished silicon wafer 26 are then placed in an oven (not shown) and heated to a temperature that is higher than the glass transition temperature of the polymeric material 23. Preferably, this temperature is about 300° C. Heating the polymeric film 23 to a temperature higher than its glass transition temperature makes the polymeric film 23 more compliant with the unpolished side of the silicon wafer 26 as shown in FIG. 24B. The surface roughness of the unpolished side of the silicon wafer 25 prevents the polymeric film 23 from adhering to the silicon wafer 26.

The released membrane structure 25 and silicon wafer 26 are allowed to cool down to room temperature, following which the polymeric film 23 will contract more than the silicon substrate 26 and the tensile stress in the polymeric film 23 of the released membrane structure 25 is restored as shown in FIG. 24C.

As an alternative to the $Si_3N_4$ used in the above disclosed embodiments, $SiO_2$ can be used. The method of deposition for $SiO_2$ includes thermal deposition. With $SiO_2$ being deposited on both sides of the silicon wafer, etching is accomplished by using ethylene diamine pyrocatechol (EDP). The disadvantages of EDP are that it etches high resistivity silicon wafers slowly or not at all and releases byproducts that tend to get deposited on other parts of the device; the device must be cleaned more rigorously following etching steps using EDP.

In addition, as an alternative to the silicon wafers 4 and 14 disclosed in the previous embodiments, GaAs can be used as a substrate. With GaAs wafers, $Si_xN_y$ deposited using PECVD or LPCVD is preferred.

Although the present invention has been described with respect to specific embodiments thereof, various changes and modifications can be carried out by those skilled in the art without departing from the scope of the invention. It is intended, therefore, that the present invention encompass changes and modifications falling within the scope of the appended claims.

What is claimed is:

1. A process for fabricating membrane-substrate structures comprising:
   providing a substrate;
   depositing a protective layer on said substrate;
   forming a trench in said substrate, said trench having a trench depth;
   depositing a first intermediate layer in said trench;
   depositing a sacrificial layer on said first intermediate layer, said sacrificial layer having a sacrificial layer depth;
   depositing and patterning a second intermediate layer on said sacrificial layer;
   depositing a layer of polymeric material on said second intermediate layer and said sacrificial layer, said layer of polymeric material contacting said second intermediate layer; removing said sacrificial layer; and
   forming an air gap between the layer of polymeric material and the substrate by release of said layer of polymeric material upon removal of said sacrificial layer, whereby said air gap has an air gap depth greater than said sacrificial layer depth.

2. The process of claim 1, wherein said substrate comprises silicon.

3. The process of claim 2, wherein said protective layer is made of $Si_xN_y$ or $SiO_2$, wherein x and y are greater than zero, x being less than y.

4. The process of claim 1, wherein said substrate comprises GaAs.

5. The process of claim 4, wherein said protective layer is made of $Si_xN_y$, wherein x and y are greater than zero, x being less than y.

6. The process of claim 1 further comprising the steps of:
   curing said layer of polymeric material;
   depositing a mask on said layer of polymeric material; patterning said mask to have mask holes; etching said layer of polymeric material in correspondence of the mask holes, thus providing film holes in the layer of polymeric material; and
   removing said mask before removing said sacrificial layer.

7. The process of claim 3, wherein said layer of $Si_xN_y$ or $SiO_2$ is 0.5 μm thick.

8. The process of claim 3, wherein said layer of $Si_xN_y$ is deposited onto said wafer by plasma enhanced chemical vapor deposition or low pressure chemical vapor deposition.

9. The process of claim 3, wherein said layer is made of $SiO_2$ and is deposited onto said substrate by thermal deposition.

10. The process of claim 5, wherein said layer is made of $Si_xN_y$ and is deposited onto said substrate by plasma enhanced chemical vapor deposition or low pressure chemical vapor deposition.

11. The process of claim 1, wherein said trench is etched in said substrate using a KOH solution.

12. The process of claim 1, wherein said trench is etched in said substrate using ethylene diamine pyrocatechol.

13. The process of claim 1, wherein said trench has a depth of between about 5 μm and 50 μm.

14. The process of claim 1, wherein said metal comprises a Ti—Au film having a thickness of about 1 μm.

15. The process of claim 1, wherein said membrane pad comprises a Ti—Au film having a thickness of about 1 μm.

16. The process of claim 1, wherein said sacrificial layer comprises metal, PECVD $SiO_2$, or KCl.

17. The process of claim 1, wherein said polymeric material is polyimide.

18. The process of claim 6, wherein said polymeric material is polyimide and is cured at a temperature of about 300° C.

19. The process of claim 18, wherein said polyimide shrinks by about 20–40% upon curing.

20. The process of claim 6, wherein said mask comprises a mask metal.

21. The process of claim 20, wherein said mask metal is Al.

22. The process of claim 6, wherein said polymeric material is etched by reactive ion etching.

23. The process of claim 6, wherein said mask is removed by an etchant and said sacrificial layer is removed by BOE or hot deionized water.

24. The process of claim 1, wherein said sacrificial layer comprises at least one of KCl and PECVD $SiO_2$.

25. The process of claim 1, further comprising:
   removing the protective layer.

26. A process for fabricating membrane-substrate structures comprising the steps of:
   providing a substrate having a one side and an other side;
   depositing a first protective layer on said one side and a second protective layer on said other side;
   forming a trench in said substrate, said trench having a trench depth;
   depositing a third protective layer in said trench; depositing a first intermediate layer on said third protective layer; depositing a sacrificial layer on said first intermediate layer and said third protective layer, said sacrificial layer having a sacrificial layer depth; depositing a second intermediate layer on said sacrificial layer;
   depositing a layer of polymeric material on said first protective layer, said second intermediate layer, and said sacrificial layer;
   removing said sacrificial layer; and
   forming an air gap between the layer of polymeric material and the substrate by release of said layer of polymeric material from said sacrificial layer upon removal of said sacrificial layer, whereby said air gap has an air gap depth greater than said sacrificial layer depth.

27. The process of claim 26, wherein said substrate comprises silicon.

28. The process of claim 27, wherein said first protective layer, said second protective layer, and said third protective layer comprise $Si_xN_y$, or $SiO_2$, x and y being greater than zero, x being less than y.

29. The process of claim 26, wherein said substrate comprises GaAs.

30. The process of claim 29, wherein said first protective layer, said second protective layer, and said third protective layer comprise $Si_xN_y$, x and y being greater than zero, x being less than y.

31. The process of claim 26, wherein said step of removing said sacrificial layer comprises the steps of:
   providing access holes in said second protective layer;
   etching a portion of the substrate above said access holes; and
   removing said third protective layer and said sacrificial layer.

32. The process of claim 28, wherein said layer of $Si_xN_y$ or $SiO_2$ is 0.5 µm thick.

33. The process of claim 28, wherein said first protective layer, second protective layer, and third protective layer comprise $Si_xN_y$, and are deposited onto said substrate by plasma enhanced chemical vapor deposition or low pressure chemical vapor deposition.

34. The process of claim 28, wherein said first protective layer, second protective layer, and third protective layer comprise $SiO_2$ and are deposited onto said wafer by thermal deposition.

35. The process of claim 30, wherein said first protective layer, second protective layer, and third protective layer are deposited onto said wafer by plasma enhanced chemical vapor deposition or low pressure chemical vapor deposition.

36. The process of claim 26, wherein said trench is etched in said substrate using a KOH solution.

37. The process of claim 26, wherein said trench is etched in said substrate using ethylene diamine pyrocatechol.

38. The process of claim 26, wherein said trench has a depth of between about 5 µm and about 50 µm.

39. The process of claim 26, wherein said metal comprises a Ti—Au film having a thickness of about 1 µm.

40. The process of claim 26, wherein said second intermediate layer comprises a Ti—Au film having a thickness of about 1 µm.

41. The process of claim 26, wherein said sacrificial layer comprises metal, PECVD $SiO_2$, or KCl.

42. The process of claim 26, wherein said polymeric material is polyimide.

43. The process of claim 26, wherein said polymeric material is cured at a temperature of about 300° C.

44. The process of claim 43, wherein said polymeric material shrinks by about 20–40% upon curing.

45. The process of claim 31, wherein said polymeric material is etched by reactive ion etching.

46. The process of claim 31, wherein said sacrificial layer is removed by BOE or hot deionized water.

47. The process of claim 26, wherein said sacrificial layer comprises at least one of KCl and $SiO_2$.

48. The process of claim 26, further comprising the step of:
   removing the first protective layer.

49. A process for restoring tensile stress to a monolithic membrane-substrate structure comprising the steps of:
   a) fabricating a membrane-substrate structure, said step of fabricating the membrane-substrate structure comprising:
      a1) providing a substrate having a one side and an other side;
      a2) depositing a first protective layer on said one side and a second protective layer on said other side;
      a3) forming a trench in said substrate, said trench having a trench depth;
      a4) depositing a third protective layer in said french;
      a5) depositing a first intermediate layer on said third protective layer;
      a6) depositing a sacrificial layer on said first intermediate layer and said
   third protective layer, said sacrificial layer having a sacrificial layer depth;
      a7) depositing a second intermediate layer on said sacrificial layer;
      a8) depositing a layer of polymeric material on said first protective layer,
   said second intermediate layer, and said sacrificial layer;
      a9) removing said sacrificial layer; and
      a10) forming an air gap between the layer of polymeric material and the substrate by release of said layer of polymeric material from said sacrificial layer upon removal of said sacrificial layer, whereby said air gap has an air gap depth greater than said sacrificial layer depth;
   b) providing a wafer;
   c) disposing said membrane-substrate structure on said wafer;
   d) heating said wafer and said membrane-substrate structure; and
   e) cooling said wafer and said membrane-substrate structure to room temperature.

50. The process of claim 49, wherein said wafer and said membrane-substrate structure are heated to about 300° C.

51. A process for restoring tensile stress to a monolithic membrane-substrate structure comprising the steps of:
   a) fabricating a membrane-substrate structure, said step of fabricating the membrane-substrate structure comprising:
      a1) providing a substrate;
      a2) depositing a protective layer on said substrate;
      a3) forming a trench in said substrate, said trench having a trench depth;
      a4) depositing a first intermediate layer in said trench;
      a5) depositing a sacrificial layer on said first intermediate layer, said sacrificial layer having a sacrificial layer depth;
      a6) depositing and patterning a second intermediate layer on said sacrificial layer;
      a7) depositing a layer of polymeric material on said second intermediate layer and said sacrificial layer, said layer of polymeric material contacting said second intermediate layer;
      a8) removing said sacrificial layer, and
      a9) forming an air gap between the layer of polymeric material and the substrate by release of said layer of polymeric material upon removal of said sacrificial layer, whereby said air gap has an air gap depth greater than said sacrificial layer depth;
   b) providing a wafer;
   c) disposing said membrane-substrate structure on said wafer;
   d) heating said wafer and said membrane-substrate structure; and
   e) cooling said wafer and said membrane-substrate structure to room temperature.

52. The method process of claim 51, wherein said wafer and said membrane-substrate structure are heated at about 300° C.

* * * * *

UNITED STATES PATENT AND TRADEMARK OFFICE
CERTIFICATE OF CORRECTION

| | | |
|---|---|---|
| PATENT NO. | : 7,128,843 B2 | Page 1 of 1 |
| APPLICATION NO. | : 10/786824 | |
| DATED | : October 31, 2006 | |
| INVENTOR(S) | : Sarabijt Mehta | |

It is certified that error appears in the above-identified patent and that said Letters Patent is hereby corrected as shown below:

Column 1, line 12, add the following new paragraph:

--STATEMENT REGARDING FEDERALLY SPONSORED RESEARCH OR DEVELOPMENT
The present invention was made with support from the United States Government under contract number MDA972-00-c-0030 awarded by DARPA TASS Program. The United States Government has certain rights in the invention.--

Signed and Sealed this

Thirteenth Day of February, 2007

JON W. DUDAS
*Director of the United States Patent and Trademark Office*